United States Patent [19]

Kasperkovitz

[11] Patent Number: 4,631,499
[45] Date of Patent: Dec. 23, 1986

[54] PHASE-LOCKED LOOP FOR A DIRECTLY MIXING SYNCHRONOUS AM-RECEIVER

[75] Inventor: Wolfdietrich G. Kasperkovitz, Eindhoven, Netherlands

[73] Assignee: U.S. Philips Corporation, New York, N.Y.

[21] Appl. No.: 801,543

[22] Filed: Nov. 25, 1985

[30] Foreign Application Priority Data

Nov. 30, 1984 [NL] Netherlands ............ 8403648

[51] Int. Cl.$^4$ .......... H03L 7/06; H03D 3/18; H03K 9/02
[52] U.S. Cl. ............... 331/11; 331/15; 331/22; 331/31; 331/32; 329/50; 329/109
[58] Field of Search ............ 331/15, 18, 25, 30, 331/31, 1 R, 10, 11, 12, 17, 22, 32; 329/50, 109, 110, 123–124, 131–132, 134–136, 150, 153–154; 375/120; 455/260, 337, 214; 328/133, 134; 307/516

[56] References Cited

FOREIGN PATENT DOCUMENTS 2077533 12/1981 United Kingdom ............ 329/50
2130826 6/1984 United Kingdom .

Primary Examiner—Eugene R. Laroche
Assistant Examiner—D. C. Mis
Attorney, Agent, or Firm—Thomas A. Briody; William J. Streeter; Marianne R. Rich

[57] ABSTRACT

A phase-locked loop is constituted by a controllable oscillator coupled through a phase detection arrangement and a low-pass filter to receive an input carrier applied to a signal input of the phase detection arrangement. In order to decrease the phase synchronization between a carrier locally generated in the loop and an input carrier, an unwanted DC offset generated during phase detection is reduced. The phase detection arrangement has first, second and third cascade-coupled mixer stages. An auxiliary mixing signal is applied from a signal generator to the first and third mixer stages. An input of one of the first and second mixer stages is coupled to the signal input of the phase detection arrangement and an input of the other of the two last-mentioned stages is coupled to an output of the controllable oscillator. The low-pass filter has a cut-off frequency lower than the fundamental frequency of the auxiliary mixing signal, and the fundamental frequency is lower than the frequency of the input carrier. The phase-locked loop is used to generate a synchronous RF carrier in a directly mixing AM receiver.

9 Claims, 4 Drawing Figures

PHASE-LOCKED LOOP FOR A DIRECTLY MIXING SYNCHRONOUS AM-RECEIVER

BACKGROUND OF THE INVENTION

1. Field of the Invention

The invention relates to a phase-locked loop comprising a controllable oscillator which is phase-coupled through a phase detection arrangement and a lowpass filter to an input carrier applied to a signal input of the phase detection arrangement, and relates also to a directly mixing synchronous AM-receiver provided with an RF input which is coupled to a synchronous AM detector to which a synchronous RF carrier is applied through a synchronous in-phase carrier input for direct conversion of an RF-AM receiver signal to the base band, comprising such a phase-locked loop for generating the synchronous RF carrier.

2. Description of the Prior Art

A phase-locked loop of the type described, used in a directly mixing synchronous AM-receiver—alternatively called Costas receiver—is shown in, for example, German Patent Application No. 3240565 laid open to public inspection.

The said phase-locked loop is generally used for generating a carrier which is phase-synchronous with an input carrier applied to the signal input and is used in many types of arrangements. An important field of application beside the afore-mentioned directly mixing synchronous AM-receivers is formed by stereo decoders such as, for example, the integrated FM stereo decoder TEA 5580 in which the phase-locked loop is used for generating one or more carriers which are phase-synchronous with the 19 kHz stereo pilot signal of a stereo multiplex signal.

The accuracy with which the phase of the generated carrier follows the phase of an input carrier is limited in the known phase-locked loop by an undesired parasitic DC offset of the oscillator control signal. This parasitic DC offset is mainly caused by switching and/or bias voltage asymmetries which cannot be entirely avoided in practice. As a result the generated carrier exhibits a fundamental phase error with respect to the input carrier, which error disturbs the signal processing performed with the generated carrier. For example, such as phase error, when using the known phase-locked loop in a stero decoder, gives rise to undesired cross-talk between the left and/or right-hand stero channels.

When the known phase-locked loop is used in a directly mixing synchronous AM-receiver—such as the above mentioned Costas receiver—the said phase error causes a phase difference between the modulated RF input carrier applied to the synchronous detector and said generated carrier and hence a distortion of the picture and/or sound signal at the output of the synchronous detector. Dependent on the field of application of the receiver, phase errors are permissible to a limited extent: for example, in a well-tried construction of double sideband AM radio receiver it was revealed that the signal distortion at a phase error of up to approximately $\pi/6$ rad was still acceptable and at a further increase of the phase error its audibility was found to increase particularly strongly. When used in a TV receiver, the acceptable phase error is much smaller.

The amplitude of the phase error significantly increases when the S/N (signal-to-noise) ratio of the RF input carrier decreases, particularly due to a decrease in field strength. As a result the dynamic input range, or the dynamic rnage of the known directly mixing synchronous AM-receiver is comparatively small. In the given embodiment the ratio between the field strength at which the receiver was just not limiting and the field strength at which the said permissible phase error of $\pi/6$ rad occurred was found to be approximately 30 dB. The range of applications of the known directly mixing synchronous AM-receiver is therefore very limited and is much smaller than, for example, that of existing integrated AM synchronous receivers which are based on the superheterodyne principle and which may have a dynamic range of 60 to 70 dB.

SUMMARY OF THE INVENTION

A first object of the invention is to provide a phase-locked loop whose oscillator signal follows a carrier applied to the signal input in phase more accurately than with the known phase-locked loop.

A second object of the invention is to provide a directly mixing synchronous AM-receiver having a dynamic range which is comparable to that of most existing conventional superheterodyne AM receivers and is at least greater than that of the known directly mixing synchronous AM-receivers.

To realise the first object, the phase-locked loop according to the invention of the type described in the opening paragraph, is characterized in that the phase detection arrangement comprises first, second and third mixer stages which are mutually coupled in succession, an auxiliary mixing signal being applied to said first and third mixer stages from a signal generator, an input of one of the first and second mixer stages being connected to the signal input of the phase detection arrangement and an input of the other of the two last-mentioned mixer stages being coupled to an output of the controllable oscillator, said low-pass filter having a cut-off frequency which is lower than the fundamental frequency of said auxiliary mixing signal, said fundamental frequency being lower than the frequency of the input carrier.

The invention makes use of the fact that the total parasitic DC offset in the loop is mainly determined by the DC offset in the phase detection arrangement. The invention is based on the recognition that a reduction of the interference component as a result of the latter DC offset in the oscillator control signal can be obtained by storing the phase information—that is to say, the phase difference between the generated carrier and the input carrier—in the amplitude of a carrier signal, by increasing this carrier signal or AC phase difference signal by means of selection and/or amplification with respect to interference components caused by unwanted parasitic DC offsets and by subsequently converting this AC phase difference signal into a DC phase difference signal.

When using the measure according to the invention, the unwanted DC offset components of the first and second mixer stages are to this end converted to frequency values which are located outside the pass region of the lowpass filter, so that these components do not influence the DC phase difference signal applied to the controllable oscillator. In addition, a conversion gain is effected in practice, at least in the mixer stage which is connected to the signal input of the phase detection arrangement, so that the phase difference signal is amplified with respect to the DC offset of the third mixer stage. The influence of the DC offsets of the circuits in the phase detection arrangement and the level of the oscillator control signal is consequently substantially eliminated, which results in a phase synchronism between the generated carrier and the input carrier which is more satisfactory that in the known phase-locked loop.

A preferred embodiment of a phase-locked loop according to the invention is characterized in that the signal input is coupled to the input of the second mixer stage and the controllable oscillator is coupled to the input of the first mixer stage.

When using this embodiment, the noise caused in the first mixer stage is prevented from disturbing the oscillation control signal. In addition, only locally generated signals are mixed in the first mixer stage, which signals, independent of the amplitude of the input carrier, may be sufficiently large to drive this first mixer stage in its switching state. The ratio between the magnitude of the unwanted DC offset and the amplitude of the oscillator signal modulated by the auxiliary mixing signal present at the output of the first mixer stage can therefore be minimally low and thus also its contribution to the total DC offset of the phase detection arrangement as a whole.

A further preferred embodiment of a phase-locked loop of the type described is characterized in that a filter device is arranged between the second and third mixer stages for selecting the frequency component in the output signal of the second mixer stage, which component is located at the fundamental frequency of the auxiliary mixing signal and that a delay circuit is arranged between the signal generator and the third mixer stage.

When using this step, the amplitude of the signal applid to the third mixer stage is determined by the phase difference between the generated carrier and the input carrier and is not distributed by parasitic DC offsets in the circuits preceding this mixer stage or by interference components which result in unwanted DC interference components by mixing in the third mixer stage with higher order harmonics of the auxiliary mixing signal. The auxiliary mixing signal applied to the third mixer stage can be delayed with the aid of the delay circuit over the same period as the phase information signal in the filter device so that both signals arrive at the third mixer stage in their mutually correct phase relation.

A further preferred embodiment is characterized in that an amplifier/limiter is arranged between the filter device and the third mixer stage.

When using this additional feature, an infinite loop gain is in principle possible to the phase-locked loop and hence a negligible phase error in the entire locking range of the loop. In addition, by a correct choice of the limiting level of the limiter and of the signal gain below this limiting level, the range of amplitude variation the AC phase difference signal applied to the third mixer stage is adequately adapted to the input dynamic range of the third mixer stage.

Besides, for weak and very noisy input signals, the signal gain below the limiting level results in the phase difference component in the oscillator control signal at the output of the phase detection arrangement being further increasing with respect to the unwanted DC offset of the third mixer stage.

The location of the amplifier/limiter between the filter device and the third mixer stage makes it possible, when using a square-wave auxiliary mixing signal, to restore a possible loss of edge steepness caused by the selective operation of the filter device.

The amplifier/limiter is preferably provided with a negative feedback path to prevent a DC offset from occurring in the output signal.

To realize said second object of the invention, a directly mixing synchronous AM-receiver of the type described in the opening paragraph is characterized by a phase-locked loop in accordance with one of the aforementioned measures whose signal input is coupled to the input of the second mixer stage and to the RF input of the receiver, the controllable oscillator also functioning as a tuning oscillator and having one end coupled to the carrier input of the synchronous AM detector and the other end to the input of the first mixer stage, the fundamental frequency of the auxiliary mixing signal being lower than the highest modulation frequency in the RF-AM receiver signal.

This measure is based on the recognition that the dynamic range of the known, directly mixing synchronous AM-receiver can be considerably increased by reducing the DC offset of the phase detection arrangement.

When using the measure according to the invention, the noise contribution of the phase detection arrangement is at a minimum and the phase synchronism between the generated carrier and the RF input carrier is sufficiently accurate to maintain an undistorted signal demodulation, even in the case of a comparatively low field strength and/or in the presence of strong neighbouring transmitters.

A preferred embodiment of a directly mixing synchronous AM-receiver of the type described, is characterized by a phase-locked loop which in accordance with one of the afore-mentioned measures includes a filter device interposed between the second and third mixer stages for selecting a frequency component in the output signal of the second mixer stage, which component is located at the fundamental frequency of the auxiliary mixing signal, and a delay circuit arranged between the signal generator and the third mixer stage, the auxiliary mixing signal being frequency-modulated with a pseudo-random signal and containing no DC information.

When using this measure, transmitters which relative to the desired transmitter are located at a frequency distance corresponding to a higher harmonic of the fundamental wave of the auxiliary mixing signal can be prevented from being converted to the passband of the said filter device and thus effect an unwanted phase lock of the phase-locked loop. Due to the pseudo-random character of the modulation signal, the energy of the received signals of such transmitters is spread in frequency over a large range around the frequency of the desired transmitter, which range is for the greater part beyond the pass range of the filter device. Because of the absence of a DC component in the auxiliary mixing signal, the auxiliary mixing signal is prevented from causing a DC offset of the AC phase difference signal at the output of the second mixer stage.

BRIEF DESCRIPTION OF THE DRAWING

The invention will be described in greater detail with reference to the Figures shown in the drawing.

In this drawing.

DESCRIPTION OF THE PREFERRED EMBODIMENTS

Figure 1:
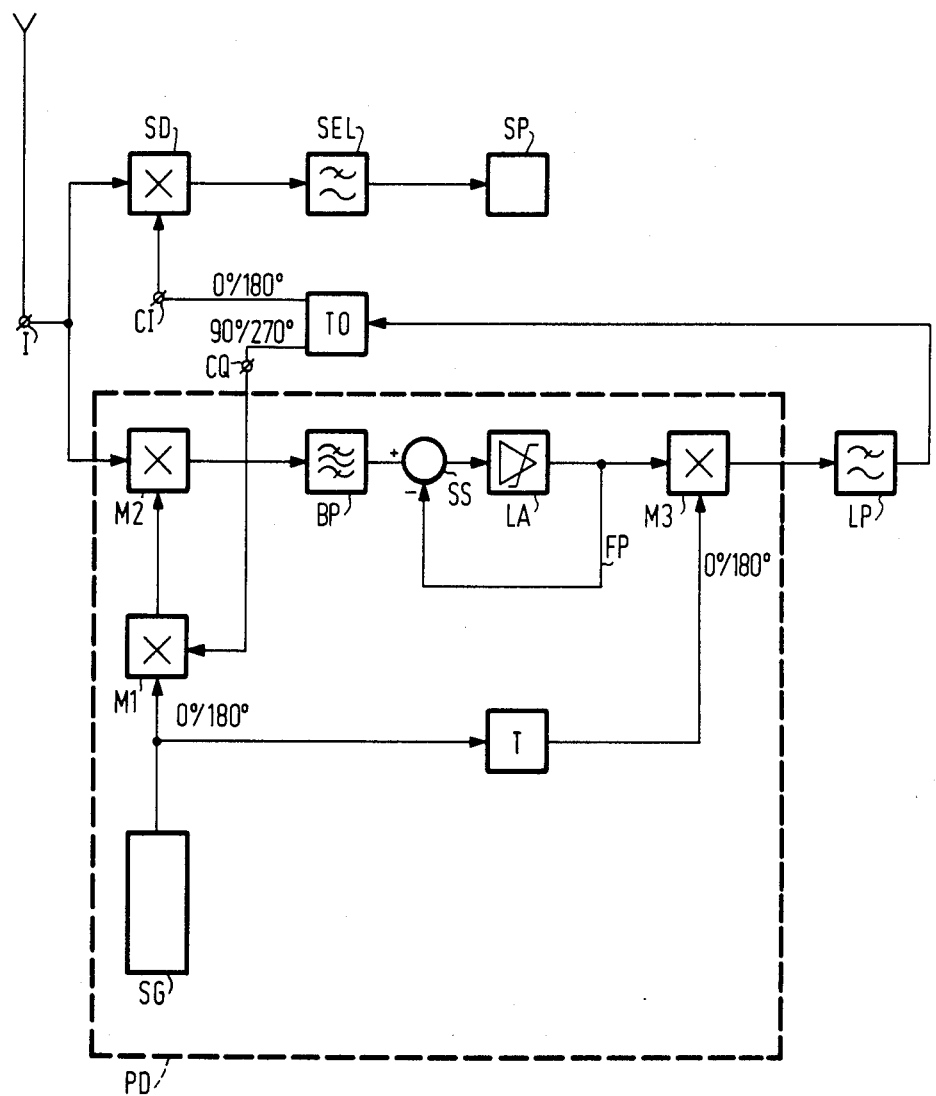
FIG. 1 shows a directly mixing synchronous AM-receiver including a phase-locked loop according to the invention.

FIG. 1 shows a directly mixing synchronous AM-receiver according to the invention. It has an RF input I to which a signal branch SD, SEL, SP and also a phase-locked loop PD, LP, TO are coupled. This signal branch comprises a synchronous AM detector SD, to which a received RF-AM input signal is applied from the RF-input I and to which a locally generated synchronous in-phase RF carrier is applied from a controllable oscillator TO, functioning as a tuning oscillator, via a synchronous in-phase carrier output CI. In the synchronous AM detector SD a direct conversion is effected of the receiver RF-AM input signal to the baseband. The baseband modulation signal thus obtained is subsequently applied through a selector SEL to a signal processing unit SP in which the selected modulation signal is further processed in known manner and converted into visible and/or audible signals.

The phase-locked loop is formed by a successive coupling of a phase detection arrangement PD, a low-pass filter LP and the tuning oscillator TO referred to above. The RF input I functions as a signal input of the phase-locked loop PD, LP, TO, a received AM-modulated RF input carrier being applied thereto. A synchronous local quadrature RF carrier is applied from the tuning oscillator TO through a synchronous quadrature carrier output CQ to the phase detection arrangement PD. This local quadrature RF carrier differs 90° in phase from the local in-phase RF carrier applied to the synchronous AM detector SD, and in the locked condition of the phase-locked loop, also with the received RF input carrier. To this end, the phase detection arrangement PD supplies a DC phase difference signal whose amplitude and phase vary in dependence upon the phase differences deviating from 90° between the carriers applied to this phase detection arrangement PD. This DC phase difference signal is applied, after passing through low-pass filter LP, as an oscillator control signal to the tuning oscillator TO through which a negative feedback of these phase differences is effected. In case of a sufficiently large loop gain and in the absence or substantial absence of parasitic DC offsets of the oscillator control signal, the phase differences are negligibly small and the local in-phase and quadrature carriers are in phase synchronism with the RF input carrier. The operation described so far of the directly mixing synchronous AM-receiver and the phase-locked loop therein is known per se, for example, from the afore-mentioned German Patent Application.

The phase detection arrangement of the phase-locked loop according to the invention comprises first, second and third mixer stages $M_1$, $M_2$ and $M_3$ which are mutially coupled in succession, a signal generator SG which is coupled at one end of the first mixer stage $M_1$ and at the other end through a delay circuit T to the third mixer stage $M_3$, as well as a bandpass filter BP functioning as a filter device and an amplifier/limiter LA arranged in succession between the second and third mixer stages $M_2$ and $M_3$. In the embodiment shown in FIG. 1 the tuning oocillator TO is coupled through the synchronous quadrature carrier output CQ to the first mixer stage $M_1$, the RF input I functioning as a signal input is coupled to the second mixer stage $M_2$ and the third mixer stage $M_3$ is coupled to the lowpass filter LP of the loop.

The signal generator SG supplies an auxiliary mixing signal in which only AC information and preferably no DC information occurs. There is a wide class of signal or function generators satisfying this condition. In practice the auxiliary mixing signal is a square wave with a fundamental wave whose frequency is constant or which is possibly modulated with a binary pseudo-random signal. A signal generator for generating such an auxiliary mixing signal can easily be realized by those skilled in the art. Since knowledge about the exact construction of the signal generator SG is not required to understand the invention, a description thereof is omitted.

In the first mixer stage $M_1$ the auxiliary mixing signal from the signal generator SG is modulated on the local RF quadrature carrier of the tuning oscillator TO. Both the amplitude of the auxiliary mixing signal and that of the local RF quadrature carrier is preferably chosen to be sufficiently large to operate the first mixer stage $M_1$ in its switching mode, that is to say, to operate it as a switching mixer stage. The parasitic DC offset and noise produced in this first mixer stage $M_1$ are then minimal relative to the output signal amplitude.

The oscillator signal thus obtained and being modulated with the auxiliary mixing signal is applied as a mixing signal to the second mixer stage $M_2$ and mixed therein with the received RF input carrier being supplied from the RF input I. In addition to unwanted higher order mixing products and a frequency conversion of the parasitic DC offset of the first mixer stage $M_1$ and its own parasitic DC offset, also a modulation of the auxiliary mixing signal with the phase difference deviating from 90° between the RF input carrier and the local RF quadrature carrier, or with the phase difference between the RF input carrier and the local RF in-phase carrier, is brought about at this mixing operation.

If the mixing signal is also large, for example sufficiently large to operate the second mixer stage $M_2$ in its switching state as in said preferred case, a conversion gain occurs in the second mixer stage $M_2$ whereby the modulated auxiliary mixing signal is increased relative to the own parasitic DC offset of this second mixer state $M_2$. Since the original auxiliary mixing signal only comprises AC information, the phase difference information at the ouput of the second mixer $M_2$ is stored in the AC component of the modulated auxiliary mixing signal and is therefore referred to as AC phase difference signal hereinafter. This desired AC phase difference signal is frequency-separated from the higher order mixing products and the parasitic DC offset components of the first and second mixer stages $M_1$ and $M_2$ and is further increased relative to these interference components by a selection in the bandpass filter BP.

The AC phase difference signal thus selected is subsequently applied to the amplifier/limiter LA which mainly determines the loop gain. The amplifier/limiter LA exhibits a maximum gain for input signal amplitudes below a certain threshold value and such a decrease in gain for input signal amplitudes above this threshold value that the output signal amplitude is substantially maintained at the output level occurring at said threshold value. The amplifier/limiter LA is also negatively fed back for direct current through a DC negative feedback path FP and a subtractor stage SS as is shown in FIG. 1. This DC negative feedback results in further reduction of the unwanted DC component in the signal applied to the amplifier/limiter LA.

An amplifier/limiter of this type can in itself be realized easily, for example, by means of a second arrangement of an amplifier and a limiter circuit. By appropriate choice of the output limitation level, the threshold value and the maximum amplification factor of the amplifier/limiter LA. it compensates to a certain extent the input amplitude-dependent conversion gain in the second mixer stage $M_2$ so that for a large input level variation range or input dynamic range a substantially constant loop gain is obtained. At a sufficiently large amplification of the amplifier/limiter LA this loop gain may in principle be infinite, resulting in a negligible phase error in the entire locking range of the loop. In addition, the sensitivity of the phase difference signal to disturbances occurring later such as, for example, the DC offset occurring in the third mixer stage $M_3$, is greatly reduced, notably at low amplitude values. Furthermore, the amplifier/limiter LA makes it possible to realize an acceptable adaptation of the input dynamic range of the third mixer stage $M_3$ to the amplitude variation range of the AC phase difference signal. When losing edge steepness in the bandpass filter BP in case of a square-wave phase difference signal, the amplifier/limiter LA restores the edge steepness to a certain extent.

The modulated auxiliary mixing signal functioning as an AC phase difference signal is demodulated in the third mixer stage $M_3$. To this end the original auxiliary mixing signal is applied in phase or in anti-phase to the third mixer stage $M_3$, after having been delayed in the delay circuit T for a period corresponding to the group delay time of the bandpass filter BP. As a result of the amplification and selection occurring in the path preceding the third mixer stage $M_3$, the DC phase difference signal thus obtained significantly increased relative to the unwanted DC offset of the third mixer stage $M_3$. Unwanted higher order mixing products are suppressed in the low-pass filter LP so that the oscillator TO is very accurately coupled in phase synchronism with the RF carrier. The fundamental frequency of the auxiliary mixing signal should then be lower than the highest modulation frequency in the RF-AM receiver signal so as to prevent neighbouring channels from disturbing the operation of the phase-locked loop.

It will be obvious that a certain reduction of the unwanted DC offset in case of a sufficient conversion gain in the second mixture stage $M_2$ may in principle also be obtained without the bandpass filter BP, the delay circuit T, the amplifier/limiter LA, the DC negative feedback of this amplifier/limiter LA or a full suppression of the DC component in the auxiliary mixing signal. However, these circuits BP, T, LA and the suppression of the latter DC component increase this reduction to a considerable extent.

Figure 2:
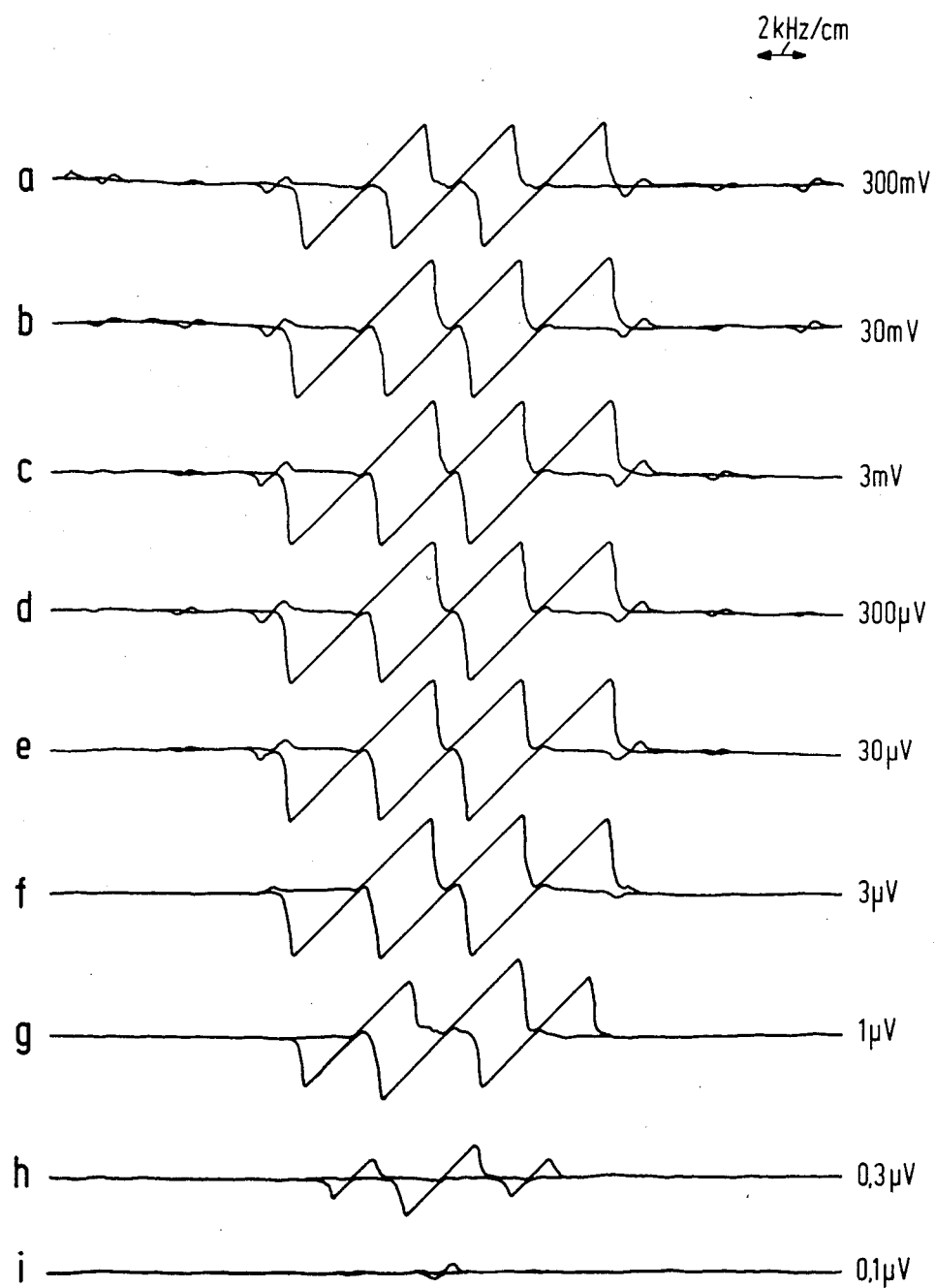
FIG. 2 shows a number of graphs a–i indicating the variation of the oscillator control signal in a receiver of FIG. 1 as a function of the input carrier frequency in the case of a square-wave auxiliary mixing signal having a constant fundamental frequency at different field strengths.

If the auxiliary mixing signal is a square wave with a fixed fundamental frequency $f_o$, additional unwanted harmonic frequencies at $+/-2n \cdot f_o (n=1, 2, \ldots)$ from the desired frequency occur, upon which the phase-locked loop can capture. Reference is made to FIG. 2 for clarification. FIG. 2 shows in graphs a-i the variation of the DC control signal applied to the tuning oscillator TO in open loop condition for the receiver of FIG. 1 as a function of the input carrier frequency when using a square wave auxiliary mixing signal having a constant fundamental frequency of 2 kHz and a loop width of 8 Hz for field strength values of 300 mV, 30 mV, 3 mV, 300 $\mu$V, 30 $\mu$V, 3 $\mu$V, 1 $\mu$V, 0.3 $\mu$V and 0.1 $\mu$V, respectively.

Figure 3:
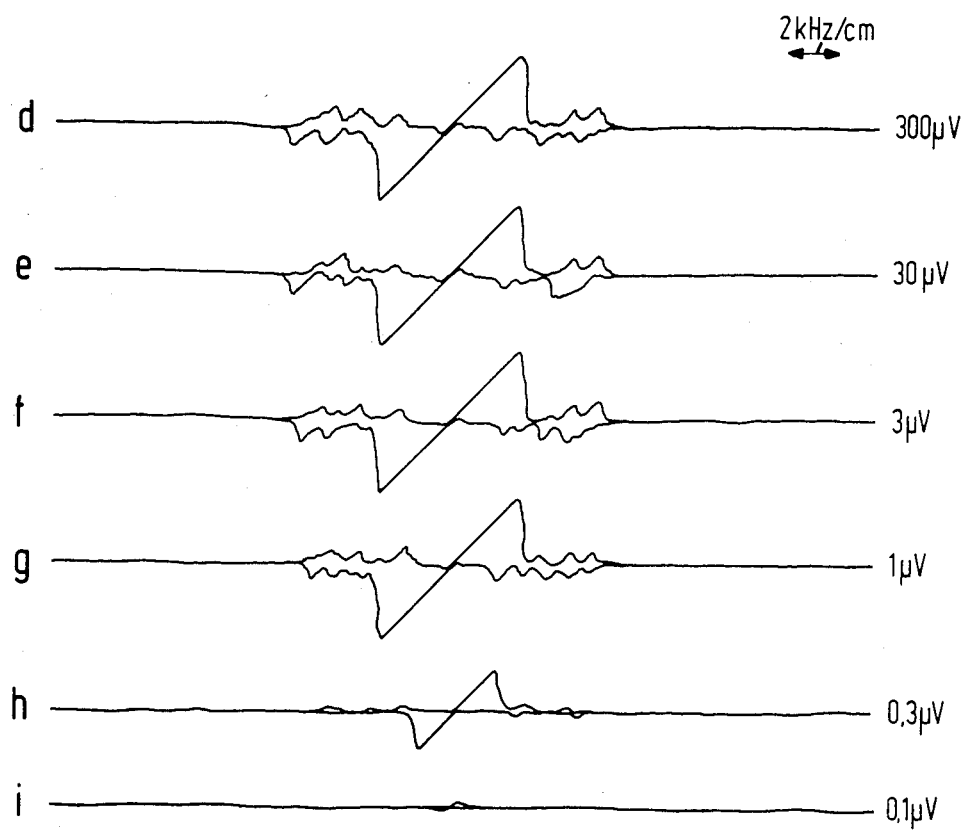
FIG. 3 shows a number of graphs indicating a similar variation as shown by the graphs d–i of the previous FIG. 2 in which the auxiliary mixing signal is frequency-modulated with a pseudo-random modulation signal.

The capute phenomena at said additional harmonic frequencies can be suppressed by frequency modulating the auxiliary mixing signal with a pseudo-random signal. As a result thereof the signal energy of these harmonic frequencies is spread over a wide frequency range which is mainly beyond the passband of the loop while that of the desired frequency is maintained. Reference is made to FIG. 3 for clarification. This FIG. 3 shows in graphs d-i the effect of a fairly simple binary pseudo-random signal which is frequency-modulated with a modulation frequency of 300 Hz on the same auxiliary mixing signal and at the same loop widths as mentioned in the description of FIG. 2, on the variation of the oscillator control signal at field strength values of 300 $\mu$V, 30 $\mu$V, 3 $\mu$V, 1 $\mu$V, 0.3 $\mu$V and 0.1 $\mu$V, respectively. The variation of the oscillator control signal at the field strength values above 300 $\mu$V hardly deviates from that at 300 $\mu$V. The bandpass filter BP is chosen dependent on the location and bandwith of the frequency spectrum of the frequency-modulated auxiliary mixing signal. On the one hand the bandpass filter BP should be sufficiently wide to pass the entire signal energy of the AC phase difference signal substantially unaffected and on the other hand it should be sufficiently narrow to suppress the said unwanted additional harmonic frequency and the parasitic DC component in the output signal of the second mixer stage $M_2$. It is found in practice that for the said modulation frequency of the auxiliary mixing signal a 3 dB passband of 2 kHz around a central value of 2 kHz for the bandpass filter BF renders satisfactory results. The delay circuit T should then be of the order of 120 $\mu$sec.

Measurements show that the dynamic range of the directly mixing synchronous AM-receiver shown in FIG. 1 is then of the order of 100 dB.

It stands to reason that the phase-locked loop (PD, LP, TO) used in the receiver of FIG. 1 may alternatively be used in a stereo decoder (not shown) for generating a 38 kHz stereo sub-carrier, which is in phase synchronism with the 19 kHz stereo pilot signal for the purpose of dematrixing the left channel and right channel stereo signals. To this end the received 19 kHz stereo pilot signal is to be applied to the signal input I of the phase-locked loop (PD, LP, TO). The effect of the measure according to the invention becomes manifest in a reduction of the unwanted cross-talk between the left channel and right channel stereo signals at the output of the stereo decoder.

Figure 4:
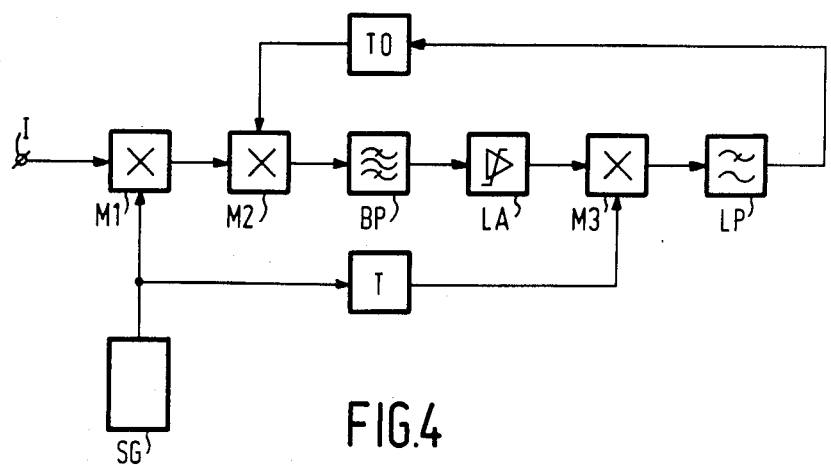
FIG. 4 shows another embodiment of a phase-locked loop according to the invention.

FIG. 4 shows a further embodiment of a phase-locked loop according to the invention in which circuits corresponding to those in FIG. 1 have the same reference indications. In contrast to the phase-locked loop of FIG. 1, the input carrier is mixed in the first mixer stage $M_1$ with the auxiliary mixing signal from the signal generator SG. By mixing with the local oscillator signal in the second mixer stage $M_2$ the AC phase difference signal is subsequently formed, which is then selected in the manner described hereinbefore in the bandpass filter BP, ampified and limited in the amplifier/limiter LA and converted into a DC phase difference signal in the third mixer stage M₃. This DC phase difference signal is applied as an oscillator control signal to the tuning oscillator TO through the lowpass filter LP.

What is claimed is:

1. A phase-locked loop comprising a controllable oscillator phase-coupled through a phase detection arrangement and a low-pass filter to receive an input carrier applied to a signal input of the phase detection arrangement, characterized in that the phase detection arrangement comprises first, second and third cascade-coupled mixer stages, an auxiliary mixing signal having a fundamental frequency being applied to said first and third mixer stages from a signal generator, an input of one of the first and second mixer stages being connected to the signal input of the phase detection arrangement and an input of the other of the two last-mentioned mixer stages being coupled to an output of the controllable oscillator, the output of said third mixer stage being coupled to said low-pass filter, said low-pass filter having a cut-off frequency which is lower than the fundamental frequency of said auxiliary mixing signal, said fundamental frequency being lower than the frequency of the input carrier.

2. A phase-locked loop as claimed in claim 1, characterized in that the signal input is coupled to the input of the second mixer stage and the controllable oscillator is coupled to the input of the first mixer stage.

3. A phase-locked loop as claimed in claim 2, characterized in that a filter device is arranged between the second and third mixer stages for selecting said fundamental frequency component in the output signal of the second mixer stage, and that a delay circuit is arranged between the signal generator and the third mixer stage.

4. A phase-locked loop as claimed in claim 3, characterized in that an amplifier/limiter is arranged between the filter device and the third mixer stage.

5. A phase-locked loop as claimed in claim 4, characterized in that the amplifier-limiter is provided with a DC negative feedback path.

6. A directly mixing synchronous AM-receiver having an RF input coupled to a synchronous AM detector to which a synchronized carrier is applied for direct conversion of a received RF-AM receiver signal to the baseband, characterized by a phase-locked loop as claimed in claim 2, the signal input of said loop being coupled to the said RF input, the controllable oscillator also functioning as a tuning oscillator and being coupled to said synchronous AM detector, the fundamental frequency of the auxiliary mixing signal being lower than the highest modulation frequency in the RF-AM receiver signal.

7. A directly mixing synchronous AM-receiver as claimed in claim 6, wherein the auxiliary mixing signal is frequency-modulated with a pseudo-random signal and at least substantially does not contain any DC information.

8. A directly mixing synchronous AM-receiver as claimed in claim 7, characterized in that the filter device includes a bandpass filter having a resonant frequency at the central frequency of the auxiliary mixing signal, and a passband which on the one hand is sufficiently narrow to suppress the DC component in the output signal of the second mixer stage and on the other hand is sufficiently wide to at least predominantly comprise the frequency spectrum of the modulated auxiliary mixing signal.

9. A directly mixing synchronous AM receiver as claimed in claim 8, characterized in that the auxiliary mixing signal is a frequency modulated square wave signal having a frequency which varies in a range of approximately 300 Hz around a central value of approximately 2 kHz, said bandpass filter having a 3 dB bandwidth of not more than 2 kHz around the said central value, the delay in the delay circuit being of the order of 120 μsec.

* * * * *